(12) United States Patent
Curley et al.

(10) Patent No.: US 9,563,548 B2
(45) Date of Patent: *Feb. 7, 2017

(54) ERROR INJECTION AND ERROR COUNTING DURING MEMORY SCRUBBING OPERATIONS

(71) Applicant: International Business Machines Corporation, Armonk, NY (US)

(72) Inventors: Lawrence D. Curley, Endwell, NY (US); Glenn D. Gilda, Binghamton, NY (US); Patrick J. Meaney, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/823,012

(22) Filed: Aug. 11, 2015

(65) Prior Publication Data

US 2015/0347256 A1 Dec. 3, 2015

Related U.S. Application Data

(63) Continuation of application No. 14/266,984, filed on May 1, 2014.

(51) Int. Cl.
*G11C 29/10* (2006.01)
*G06F 12/02* (2006.01)
(Continued)

(52) U.S. Cl.
CPC ............. *G06F 12/02* (2013.01); *G06F 11/261* (2013.01); *G06F 12/0253* (2013.01);
(Continued)

(58) Field of Classification Search
CPC ....... G06F 11/106; G06F 11/26; G06F 11/261; G06F 11/263; G06F 2211/1088; G06F 2211/4062; G06F 2212/1032; G06F 2212/1044; G11C 29/08; G11C 29/10; H03M 2201/657; H03M 13/01; H03M 13/015

See application file for complete search history.

(56) References Cited

U.S. PATENT DOCUMENTS

2007/0094569 A1* 4/2007 Thayer .................. G06F 11/106
714/763
2012/0266033 A1* 10/2012 Gold .................... G06F 11/1052
714/718

(Continued)

OTHER PUBLICATIONS

List of IBM Patents or Patent Applications Treated As Related (Appendix P), Filed Aug. 11, 2015, 2 pages.

(Continued)

*Primary Examiner* — Albert Decady
*Assistant Examiner* — Christian Dorman
(74) *Attorney, Agent, or Firm* — Cantor Colburn LLP; Margaret A. McNamara (57) ABSTRACT

Embodiments relate to performing a memory scrubbing operation that includes injecting an error on a write operation associated with a memory address. One or more errors are detected during a two-pass scrub operation on the memory address. Based on a result of the two-pass scrub operation, one or more of a hard error counter associated with the memory address and a soft error counter associated with the memory address is selected. The one or more selected counters are updated based on the result of the two-pass scrub operation.

7 Claims, 7 Drawing Sheets

(51) Int. Cl.
*G06F 11/26* (2006.01)
*G11C 29/02* (2006.01)
*G11C 29/44* (2006.01)
*G06F 11/263* (2006.01)
*G06F 11/10* (2006.01)
*G11C 11/41* (2006.01)
*G11C 29/04* (2006.01)

(52) U.S. Cl.
CPC .............. *G11C 29/02* (2013.01); *G11C 29/10* (2013.01); *G11C 29/44* (2013.01); *G06F 11/106* (2013.01); *G06F 11/26* (2013.01); *G06F 11/263* (2013.01); *G06F 2212/1032* (2013.01); *G06F 2212/1044* (2013.01); *G11C 11/41* (2013.01); *G11C 2029/0409* (2013.01)

(56) References Cited

U.S. PATENT DOCUMENTS

| | | | | |
|---|---|---|---|---|
| 2013/0139008 | A1* | 5/2013 | Kalyanasundharam | G06F 11/1064 714/703 |
| 2014/0337667 | A1* | 11/2014 | Postage .............. | G06F 11/1402 714/15 |

OTHER PUBLICATIONS

Lawrence D. Curley, et al., Pending U.S. Appl. No. 14/266,984 entitled "Error Injection and Error Counting During Memory Scrubbing Operation" filed with the U.S. Patent and Trademark Office on May 1, 2014.

\* cited by examiner

ERROR INJECTION AND ERROR COUNTING DURING MEMORY SCRUBBING OPERATIONS

DOMESTIC PRIORITY

This application is a continuation of U.S. patent application Ser. No. 14/266,984, filed May 1, 2014, the content of which is incorporated by reference herein in its entirety.

BACKGROUND

The present invention relates generally to memory systems, and more specifically, to scrubbing of memory systems.

Dynamic random access memories (DRAMs) experience occasional errors during memory reads and writes, both correctable (soft) errors and uncorrectable (hard) errors. Memory systems using DRAMs include hardware such as symbol or device-based error correcting code (ECC) circuitry, memory mirroring, redundant array of independent memory (RAIM) ECC, scrubbing, marking, sparing, and retries. When scrubbing and/or marking are implemented, counters are often utilized to record detected errors and determine the type of error encountered.

Scrubbing and marking hardware is often tested using verification models. However, it is difficult to model all the code paths so it may be more desirable to test the final hardware and software together to test for defects. Even so, it may not be practical to build hardware that will contain all possible device failures. Therefore, programmable error injection hardware can be used to cover these error scenarios. To insert injection hardware at the DRAMs or dual in-line memory modules (DIMMs) or buffer chips can be expensive. Also, in a RAIM type system, each component (e.g. buffer chip or DRAMs) has no information about first or second scrub passes as well as data types. On the other hand, the memory controller and/or host processor include ECC and cyclic redundancy check (CRC) features, as well as asynchronous paths which often hinder the ability to mimic a soft versus hard error.

SUMMARY

Embodiments include methods, systems, and computer program products for performing a memory scrubbing operation that includes injecting an error on a write operation associated with a memory address. One or more errors are detected during a two-pass scrub operation on the memory address. Based on a result of the two-pass scrub operation, one or more of a hard error counter associated with the memory address and a soft error counter associated with the memory address are selected. The one or more selected counters are updated based on the result of the two-pass scrub operation.

BRIEF DESCRIPTION OF THE DRAWINGS

The subject matter which is regarded as embodiments is particularly pointed out and distinctly claimed in the claims at the conclusion of the specification. The forgoing and other features, and advantages of the embodiments are apparent from the following detailed description taken in conjunction with the accompanying drawings in which:

DETAILED DESCRIPTION

As noted above, contemporary memory systems may detect and count errors during a memory scrub process, and then use these counts to mark defective memory modules. While some contemporary memory systems distinguish between counts of hard errors and counts of soft errors, these systems lack a comprehensive error injection scheme to allow for hard and soft error scenarios in an otherwise clean system. Some contemporary systems that do allow for device error injections often miss opportunities to inject on various data types and on specific ranks. Described herein are embodiments of a two-pass scrub (fetch followed by conditional store) that updates counts for soft, hard, and/or intermittent errors. The type of errors recorded can be programmed into the memory scrub engine. Contemporaneous two-pass scrubs put the system in a quiescent state so that memory operations are stalled in order to maintain data coherency between fetches and stores, in light of other fetches and stores that are also occurring. Embodiments of the scrub operation described herein use priority logic and address locking to maintain coherency without putting the system in a quiescent state. Embodiments of the scrub operation described herein also allow the scrub engine to be stopped in a controlled manner.

As noted above, diagnostics that test all code paths in the memory repair subsystem are desirable. Contemporaneous systems use error injection to test these code paths, but do so only on a memory fetch or a memory store, not on a fetch-store or fetch-store-fetch. Contemporaneous systems also do not inject a combination of hard and soft errors, which makes testing error count thresholds cumbersome. Disclosed herein are embodiments of error injection logic which mimic various device failure mechanisms. Various embodiments use a variety of programmable selection including data types or memory domains (e.g. data vs. key), ranks, and re-injection (via primary and secondary denotation), thus allowing a wide variety of error injections to be configured. For example, the injection can be performed on specific operation types (e.g. a scrub store, an alter command, a selftest store, or other store). As another example, limits on scrub store and/or scrub write-back can be set. As yet another example, the injection can be selectively performed on a data store or on a key store. As yet another example, errors can be injected by rank, by chip, or by quarter-line. Before describing details of embodiments of the memory scrub and injection processes, a brief overview of how these processes fit into overall memory operation will now be provided.

Figure 1:
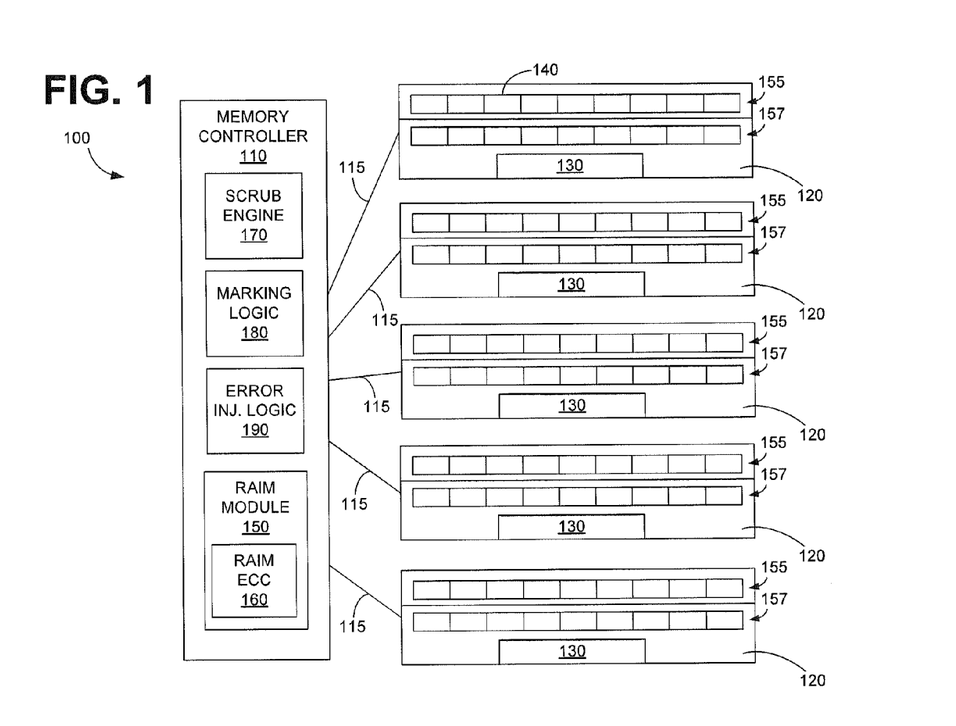
FIG. 1 depicts a memory system in accordance with an embodiment.

Turning now to FIG. 1, a block diagram of a memory system 100 in accordance with an embodiment is generally shown. The memory system 100 includes a memory controller 110 in communication with a plurality of memory modules 120 via memory interface buses 115. In this example embodiment, the modules are dual inline memory modules (DIMMs), but the techniques disclosed herein are also applicable to other types of memory modules. Each memory module 120 includes a memory buffer device 130 and memory devices 140. The memory controller 110 logically aggregates the buses 115 so that the buses 115 operate together in unison to support a single independent access request from the memory controller 110. Handling this single independent access request involves data and error detection/correction information that is distributed or "striped" across the memory interface buses 115 and associated memory devices 140. This striping or distribution function is performed by a RAIM module 150.

The memory devices 140 (sometimes referred to as chips or dies) on a memory module 120 are arranged in ranks 155, 157. In this example, a first rank 155 includes nine memory devices 140 and a second rank 157 includes nine memory devices 140. As shown in FIG. 1, a total of 45 memory devices 140 are striped across memory modules 120 for a given rank (155 or 157). Of the 45 chips accessed per rank, 32 represent data, 4 represent ECC/check bits, and 9 represent RAIM parity. This reconstruction may be referred to as error correction. The memory controller 110 includes RAIM ECC module 160, memory scrub engine 170, marking logic 180, and error injection logic 190 to facilitate memory striping, scrubbing, marking, and error injection processes. These processes will be described in further detail below.

Figure 2:
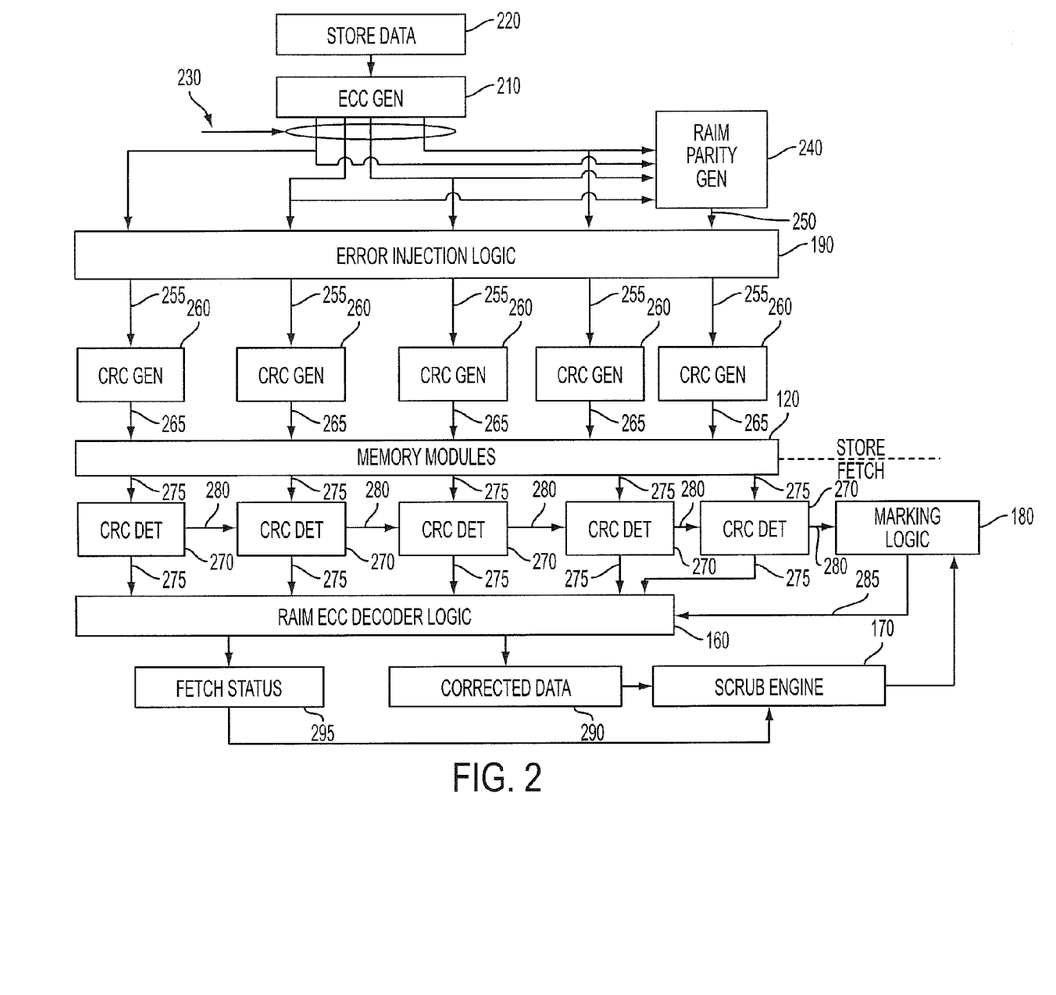
FIG. 2 depicts block diagram of store and fetch paths in accordance with an embodiment.

FIG. 2 illustrates a block diagram of RAIM store and fetch paths that implement both ECC and channel CRC in an embodiment. In an embodiment, the store path is implemented by hardware and/or software located on the memory controller 110. In addition, the store path may be implemented by hardware and/or software instructions located on a memory module 120 (e.g., in a hub device on the memory module). The RAIM configuration depicted in FIG. 2, which includes a memory channel that is dedicated to storing parity information, has some similarities to a RAID 3 configuration (i.e., striped disks with dedicated parity). However, a RAIM ECC code may be implemented that includes additional checks that are stored that allow for functionality well beyond the RAID 3 capabilities. As depicted in FIG. 2, data from the five channels are combined in a way that protects data against loss of any one memory channel (e.g., a memory module 120).

In the RAIM store path depicted in FIG. 2, the ECC generator 210 receives store data 220 and outputs four groupings of channel data 230 that include ECC check bits. The channel data 230 are input to error injection logic 190 and are also input to a RAIM parity generator 240 that outputs RAIM parity bits as channel data 250. The channel data 250 is also input to the error injection logic 190. The combination of the ECC checkbits and the RAIM parity bits described above are the overall check bits of the RAIM ECC. The error injection logic 190 provides outputs 255, which may include injected errors, on all five channels to feed to individual CRC generators 260. The CRC generators 260 then generate CRC bits for the channel data. Output 265 from the CRC generators 260, which includes CRC and data bits, are then output to a downstream portion of bus (or channel), such as bus 115 in FIG. 1, for transmission to the memory modules 120. As shown in FIG. 2, the data being stored on the memory modules 120 are supplemented by ECC. In an embodiment, the CRC bits are used for bus protection and are not stored.

In an embodiment, the fetch path is implemented by hardware and/or software located on the memory controller 110. In addition, the fetch path may be implemented by hardware and/or software instructions located on a memory module 120 (e.g., in a hub device on the memory module). As shown in FIG. 2, the RAIM fetch path includes receiving data 275 on an upstream bus, such as bus 115 in FIG. 1, from the memory modules 120. In an embodiment, the received data 275 includes data bits, ECC bits and CRC bits (generated for example, by the memory modules 120). CRC detectors 270 are utilized to detect a channel error, and to temporarily mark a failing channel. Output from the CRC detectors 270 are copies of the upstream channel data 278, which include data and ECC bits fetched back from the memory modules 120.

The CRC detectors 270 also provide an indication 280, to the marking logic 180, of which channels are in error. The marking logic 180 generates marking data 285 indicating which channels and memory chips (i.e. devices) are marked. In an embodiment, the marking logic 180 stores a vector of data indicating which, if any of the memory devices 140 in the given rank have been marked.

In addition to the error indication from the CRC detectors 270, the marking logic 180 also receives data generated by the memory scrub engine 170. The memory scrub engine 170 is executed on a periodic basis to verify the integrity of the data in the memory devices located on the memory modules 120. The memory scrub engine 170 will be described in more detail below. In one embodiment, the output from memory scrub engine 170 is stored in a table that is accessed by the marking logic 180. In another embodiment, software is used to analyze the results of the scrub engine 170 in order to load marks into the marking logic 180.

The channel data 278 and the marking data 285 are input to the RAIM ECC decoder logic 160, where the channel data 278 comprised of five interfaces from memory modules 120 are analyzed for errors which may be detected and corrected using the RAIM ECC along with the marking data 285 received from the marking logic 180. Outputs from the RAIM ECC decoder logic 160 are the corrected data 290 (in this example 64 bytes of fetched data) and a fetch status 295. Both the corrected data 290 and the fetch status 295 feed into the scrub engine 170, as well as feeding into other data destinations in the system such as a cache (not shown).

Figure 3:
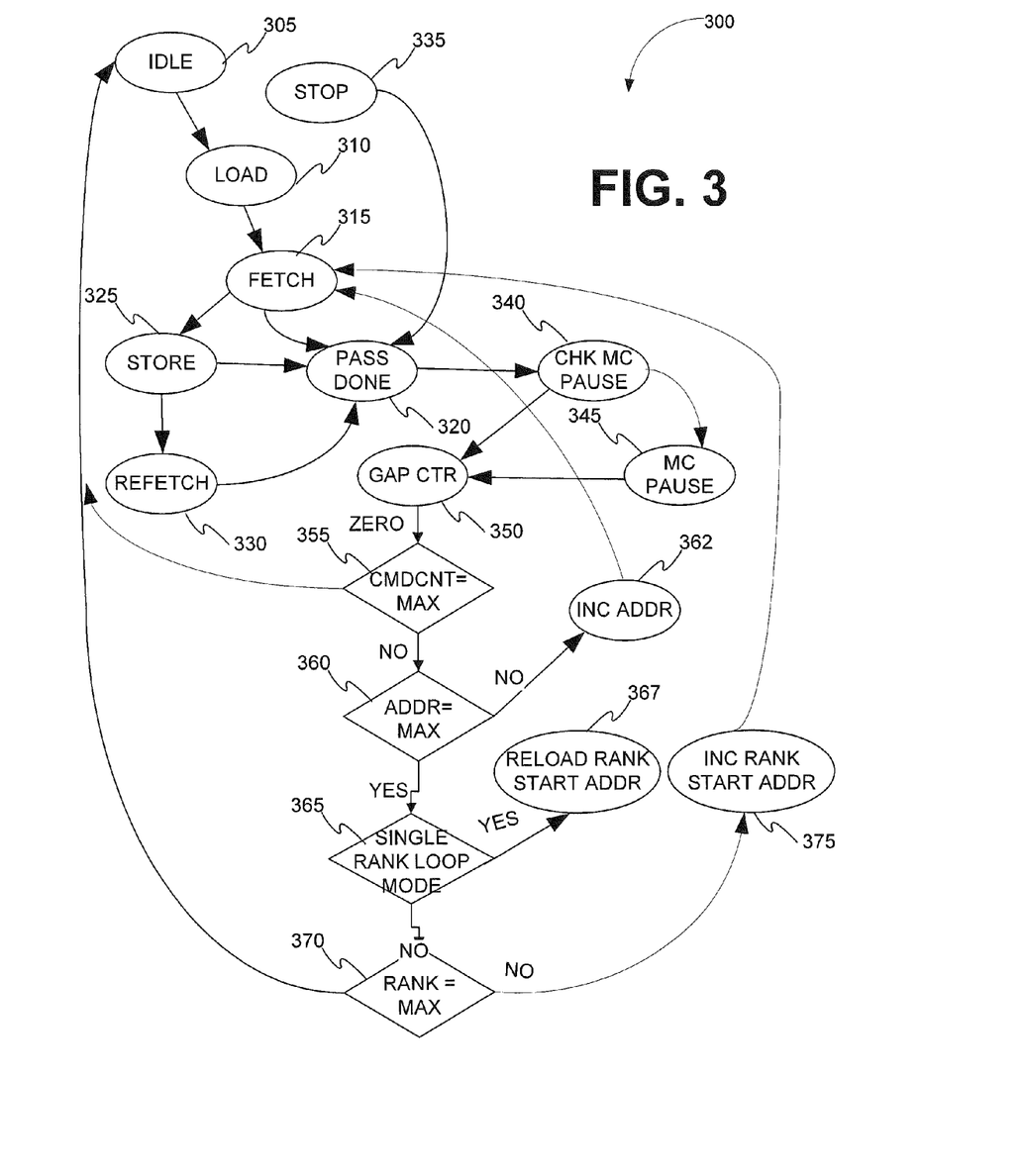
FIG. 3 depicts a state diagram of a memory scrub process in accordance with an embodiment.

Having provided an overview of the memory system 100, the memory scrubbing and error injection processes will now be described in more detail. Turning now to FIG. 3, a state diagram of a scrub process performed by the scrub state machine 300 is generally shown. The scrub state machine 300 begins from an idle state 305 and transitions to a load state 310, at which time error counters are reset and starting and ending memory addresses are loaded from configuration registers. In some embodiments, starting and ending ranks are provided. The scrub state machine 300 then proceeds to a fetch state 315, at which time the current address (initially, the starting address) is presented to a priority logic module which checks that the fetch address is not currently in use by the memory system 100. In some embodiments, the priority logic compares the current fetch address to a list of outstanding fetches/stores and stalls the scrub state machine 300 until that address is free. At that time, the priority logic gives the scrub state machine 300 high priority to use that address, and locks that address out from all other requesters.

Having been given access to the fetch address by the priority logic, the scrub state machine 300 performs the fetch and determines whether or not the fetch resulted in an error. This first fetch may be referred to herein as a "patrol fetch". If the patrol fetch did not result in an error, the scrub state machine 300 transitions to the pass done state 320 (described in further detail below). If the patrol fetch resulted in an error, some embodiments of the scrub state machine 300 increment an indiscriminate error counter (i.e., error is either hard or soft).

Having received an error on the patrol fetch, the scrub state machine 300 transitions to a store state 325. In the store state 325, the scrub state machine 300 performs a store back to the fetch address in order to correct the data back into the fetch location. While this example embodiment of FIG. 3 shows the store-back as being conditional on the results of the patrol fetch, some embodiments of the scrub state machine 300 have a configurable setting that forces a store-back on the data, regardless of whether the patrol fetch received clean or errored data. Other embodiments of the scrub state machine 300 have a configurable setting so that data is not stored back, even if the patrol fetch received data with RAIM correctable errors.

When the store is complete, the scrub state machine 300 transitions to a re-fetch state 330, where the data is read from the read address a second time and the scrub state machine 300 determines whether an error occurred on this second fetch. While this example embodiment of FIG. 3 shows the re-fetch as being conditional on the results of the patrol fetch, some embodiments of the scrub state machine 300 have a configurable setting that forces a re-fetch on the data, regardless of whether the patrol fetch received clean or RAIM correctable data. Other embodiments of the scrub state machine 300 have a configurable setting so that a re-fetch does not follow the store-back.

If the error persists on the re-fetch, this indicates that the error is a hard error. If the error was not present on the re-fetch, this indicates that the error is a soft error. The scrub state machine 300 increments one or more error counters to capture this information. In an embodiment, separate hard and soft error counters are present in the memory controller 110.

In an embodiment, configuration registers associated with the scrub state machine 300 determine which error counters are incremented, so that the scrub state machine 300 can be programmed to count hard errors, soft errors, intermittent errors, or any combination of these error types. One example of counter behavior based on fetch results is shown in Table 1:

TABLE 1

| Patrol Fetch | Second Fetch | Hard Counter | Soft Counter | Intermittent Counter |
|---|---|---|---|---|
| 0 | 0 | no increment | no increment | no increment |
| 0 | 1 | no increment | increment | increment |
| 1 | 0 | no increment | increment | no increment |
| 1 | 1 | increment | no increment | no increment |

Some embodiments of the scrub state machine 300 increment a chip-specific counter for the target rank. For example, the RAIM ECC module 160 may maintain a DRAM correction vector which indicates which DRAMs had at least one bit corrected, and scrub state machine 300 uses this vector to index into a plurality of unique counters, one per chip in the rank. In some embodiments, this DRAM correction vector is stored for future use in a register.

Having finished the patrol fetch and possibly a store-back and a re-fetch, the scrub state machine 300 exits from the current state (fetch state 315, store state 325, re-fetch state 330) by releasing the lock on the fetch address and transitioning to the pass done state 320. In the pass done state 320, the scrub state machine 300 checks for a stop command, and if present, halts the scrub process by transitioning to a stop state 335. If no stop command was issued, the scrub state machine 300 transitions to a check for millicode pause state 340. If the millicode did not issue a pause signal, the scrub state machine 300 transitions to a gap counter state 350. If the millicode did issue a pause signal, the scrub state machine 300 transitions to the millicode pause state 345, where the engine 300 pauses to allow for a test operation conflict or other millicode-initiated operation.

Upon receiving a resume signal from the millicode, the scrub state machine 300 then transitions from the millicode pause state 345 into the gap counter state 345. Once the scrub state machine enters the gap counter state 345, the gap counter is loaded with a predetermined value and counts down to zero, thus waiting for a predefined time period before transitioning to a check maximum count state 355. In the check maximum count state 355, the scrub state machine 300 compares a command counter to a maximum value. If the command counter has reached the maximum value, the scrub is finished and the scrub state machine 300 transitions back to the idle state 305.

Otherwise the scrub state machine 300 transitions to a check max address state 360, where the scrub state machine 300 determines whether all the addresses in the memory region specified during the load state 310 have been scrubbed. If the address counter has not yet reached its maximum value, the scrub state machine 300 transitions into a state 362 to increment the fetch address, then returns to the fetch state 315 to scrub the next memory address. If all addresses have been scrubbed, the scrub state machine 300 transitions to a rank loop state 365, and determines whether the scrub process has been configured to iterate over a single memory rank. If so, the scrub state machine 300 reloads the starting fetch address and returns to the fetch state 315.

If not, the scrub state machine 300 transitions to a check maximum rank state 370, and determines whether all ranks specified during the load state 310 have been scrubbed. If all ranks have been scrubbed, the scrub is complete and the scrub state machine 300 transitions back to the idle state 305. Otherwise, the scrub state machine 300 transitions to a reload state 375, where the rank is incremented and the starting fetch address is reloaded. The scrub state machine 300 returns to the fetch state 315 to scrub the next memory address.

Figure 4:
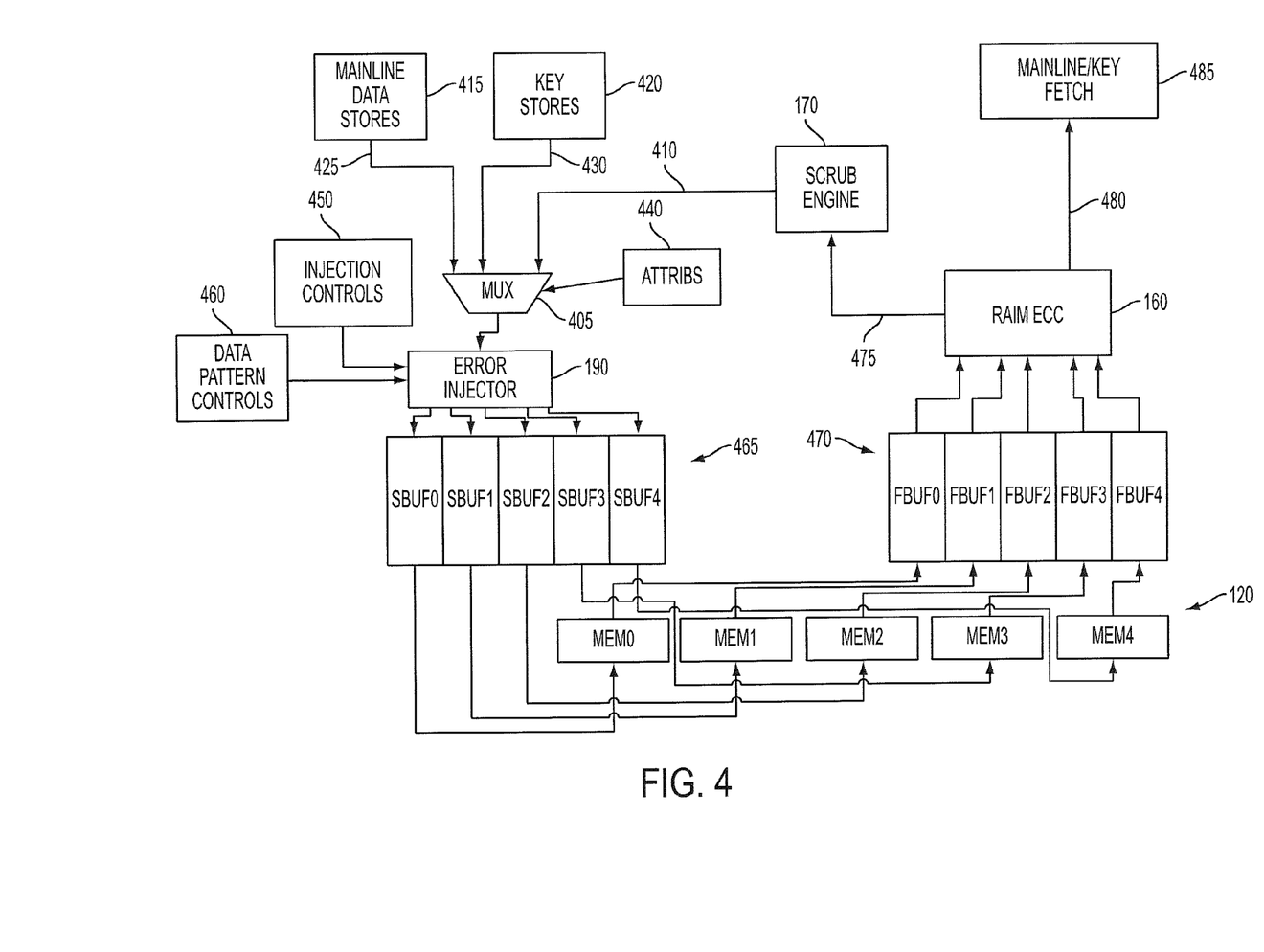
FIG. 4 depicts another block diagram of a memory system in accordance with an embodiment.

Turning now to FIG. 4, another block diagram of memory system 100 is generally shown. Where FIG. 2 focused on the data paths that allow for error detection via ECC and CRC, FIG. 4 focuses instead on the interaction between the error injection logic 190, the memory scrub engine 170, and the RAIM ECC module 160. A multiplexer 405 selects among various data inputs. Input provided by the memory scrub engine 170 is referred to as a secondary store input 410, and mainline data store 415 and key stores 420 are referred to as primary store inputs 425, 430. Various store attributes 440 such as store type, primary/secondary, rank, and key/data type are properties associated with stores. For example, a scrub store-back from the memory scrub engine 170 is considered a secondary store. The address being stored determines the rank as well as whether the transaction involves a key store or a data store. Similarly, the key stores 420 are considered primary stores in the key address region, but the address is still used to determine the store rank.

The input selected by the multiplexer 405 is provided as the data input for the error injection logic 190. A configuration register 450 provides injection controls to control the operation of the error injection logic 190, which then injects based on the configuration register 450 and the store attributes 440. Also provided as input to the error injection logic 190 are data pattern controls 460 indicating which chips and associated data bits are injected.

The outputs of the error injection logic 190 are stored in output buffer 465 for asynchronous access by the memory modules 120. In an embodiment, ECC generator 210 occurs after the multiplexer 405 and before the error injection logic 190. In another embodiment, ECC generator 210 occurs before the multiplexer 405. In an embodiment, the CRC generation occurs any time after the error injection logic 190. With CRC generation after injection, CRC detection on the interface looks clean, thus avoiding false recovery actions due to bad CRCs caused by the error injection itself. Such placement facilitates injecting actual data bits that appear to occur on the memory devices 140 on the memory modules 120, which is one goal of the error injection logic 190 in some embodiments.

As described earlier in connection with FIG. 2, fetches from memory modules 120 are provided to the memory scrub engine 170. Here, input buffers 470 are used so this data can be asynchronously accessed by the memory scrub engine 170. The RAIM ECC module 160 provides status information 475 to the memory scrub engine 170, indicating which chips have errors. Finally, at the end of the fetch path, the RAIM ECC module 160 provides corrected data 480 to the mainline and key fetch logic 485.

Table 2 describes an example of a configuration register that controls the error injection logic 190.

Table 3 describes an embodiment of a configuration register that supplies data pattern controls 460 used by the error injection logic 190. In this embodiment, there are 9 channels per rank.

TABLE 3

| # Bits | Name | Description |
| --- | --- | --- |
| 9 | MC_MEM_ERRINJ_CH0_CSEL | Chip Select for chips in Channel 0 DRAM |
| 9 | MC_MEM_ERRINJ_CH1_CSEL | Chip Select for chips in Channel 1 DRAM |
| 9 | MC_MEM_ERRINJ_CH2_CSEL | Chip Select for chips in Channel 2 DRAM |
| 9 | MC_MEM_ERRINJ_CH3_CSEL | Chip Select for chips in Channel 3 DRAM |
| 9 | MC_MEM_ERRINJ_CH4_CSEL | Chip Select for chips in Channel 4 DRAM |
| 1 | MC_MEM_ERRINJ_QL_SEL_EN | Quarter-line Select enable |
| 2 | MC_MEM_ERRINJ_QL_SEL | Quarter-line Select |
| 16 | MC_MEM_ERRINJ_INJECT | Inject Bit 0:15 |

This configuration register thus allows selecting multiple chips for simultaneous error injection across multiple channels. More specifically, multiple chips and channels can be selected for simultaneous error injection. The same bits 0:15 will be selected for each chip/channel combination. In this embodiment, bits 0:15 correspond to an ECC symbol that is stored in 2 data beats within a single DRAM with an 8 bit

TABLE 2

| # Bits | Name | Description |
| --- | --- | --- |
| 1 | MC_MEM_ERRINJ_RANK_EN | 1 - compare rank<br>0 - inject any/all ranks |
| n | MC_MEM_ERRINJ_RANK_SEL | Select which of $2^n$ ranks to inject |
| 1 | MC_MEM_ERRINJ_KEY_EN | 1 - inject into key address domain<br>0 - do not inject into key address domain |
| 1 | MC_MEM_ERRINJ_DATA_EN | 1 - inject into data address domain<br>0 - do not inject into data address domain |
| 4 | MC_MEM_ERRINJ_PRIMARY_STORE_TYPE | bit 0: 1 - inject on Alter command;<br>(Alter is special command used for targeted quiesce injection by code)<br>bit 1: 1 - inject on Selftest Store;<br>bit 2: 1 - inject on Scrub Store;<br>bit 3: 1- inject on stores not selected by bits 0:2 |
| m | MC_MEM_ERRINJ_PRI_LIMIT | Injection limit where 0 - no limit, otherwise injection limit is m |
| 1 | MC_MEM_ERRINJ_SCRUBSTR_EN | 1- Inject on the Scrub Store command (force soft to hard) |
| p | MC_MEM_ERRINJ_SEC_LIMIT | Used for scrub write-back<br>Injection limit where 0 - no limit, otherwise injection limit is p |

This configuration register thus allows injection for only a particular store type, or injection for only a particular memory domain, or injection for only a particular memory rank. If, for example, the scrub engine is configured to do a store-back after detecting a correctable error on a first fetch, then a particular number of hard errors can be modeled by setting MC_MEM_ERRINJ_SCRUBSTR_EN along with a count in MC_MEM_ERRINJ_SEC_LIMIT. A primary store type can then be chosen to inject a number of errors based on a count in MC_MEM_ERRINJ_PRI_LIMIT, detected by any non-scrub store during their normal store operations. Scrub may not typically be chosen as a primary store type in this mode. On the other hand, in an embodiment, setting scrub as a primary store type may be particularly useful when the scrub engine is configured to always do a store-back, regardless of first fetch correctable error status.

data interface. In some embodiments, the Inject Bit field allows separate bits per channel or memory device rather than the common inject bits shown in Table 3. In this embodiment, a symbol size of 16 is utilized; other embodiments utilize symbols of different sizes based, for example, on implementation considerations.

Figure 5:
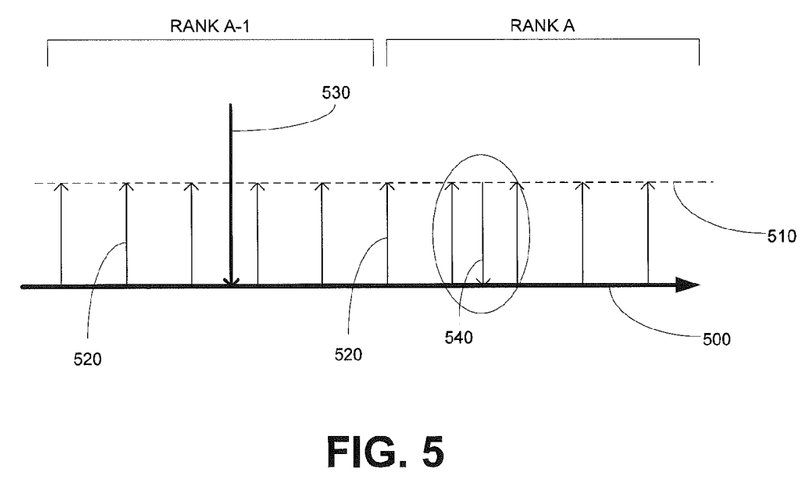
FIG. 5 depicts a timeline of an example error injection scenario in accordance with an embodiment.

Turning now to FIG. 5, a timeline 500 for an example error injection scenario is generally shown. In this example, a scrub operation is being performed, in the background, on multiple memory ranks. A diagnostic is being performed to verify the reporting of errors by the memory scrub engine 170. This diagnostic uses the error injection features of the error injection logic 190. In this diagram, dashed line 510 denotes the ongoing (background) scrub process, and individual memory fetches performed by the scrub process are denoted with up arrows 520. In this example, the memory scrub engine 170 processes memory addresses in a sequential manner through an entire rank, and then initiates another scrub operation on the next rank.

As shown in FIG. 5, the fetch and store operations may be initiated while a background scrub is occurring. In this example, a single store (denoted by down arrow 530) writes to an address X in Rank A sometime before the memory scrub engine 170 starts scrubbing Rank A. In this example, the error injection logic 190 is configured to inject a single correctable error on this primary store at an address within Rank A.

At a later point in time, the memory scrub engine 170 proceeds to rank A and eventually fetches address X, as denoted by oval 540. The memory scrub engine 170 detects a correctable error, one caused by the earlier store to address X by the error injection logic 190. The memory scrub engine 170 initiates a store-back to clean up the correctable error, and then issues a re-fetch to determine if the error is hard or soft.

In this example, the error injection logic 190 is configured with a secondary error injection event. As a result of this configuration, the memory scrub engine 170 performs a store-back, thus re-injecting the error. Since the error was re-injected, when the memory scrub engine 170 performs the re-fetch on address X, it will see that the error is still present and will count this as a hard error. The error injection logic 190 thus allows many different scrub scenarios to be performed and many code paths in the diagnostic to be exercised.

Various embodiments of error injection logic 190 may support a variety of other error injection behaviors and scrub scenarios. For example, both primary and secondary counters can be set to perform multiple error injections. This allows invocation of a threshold function for setting a chip or a channel mark. As another example, a region within a rank can be selected by specifying a primary store type that targets a particular memory region (e.g., keys or data space). As yet another example, store types by function can be selected for injection. One example of a functional store type is memory self-test operations during initial machine load (IML).

Figure 6:
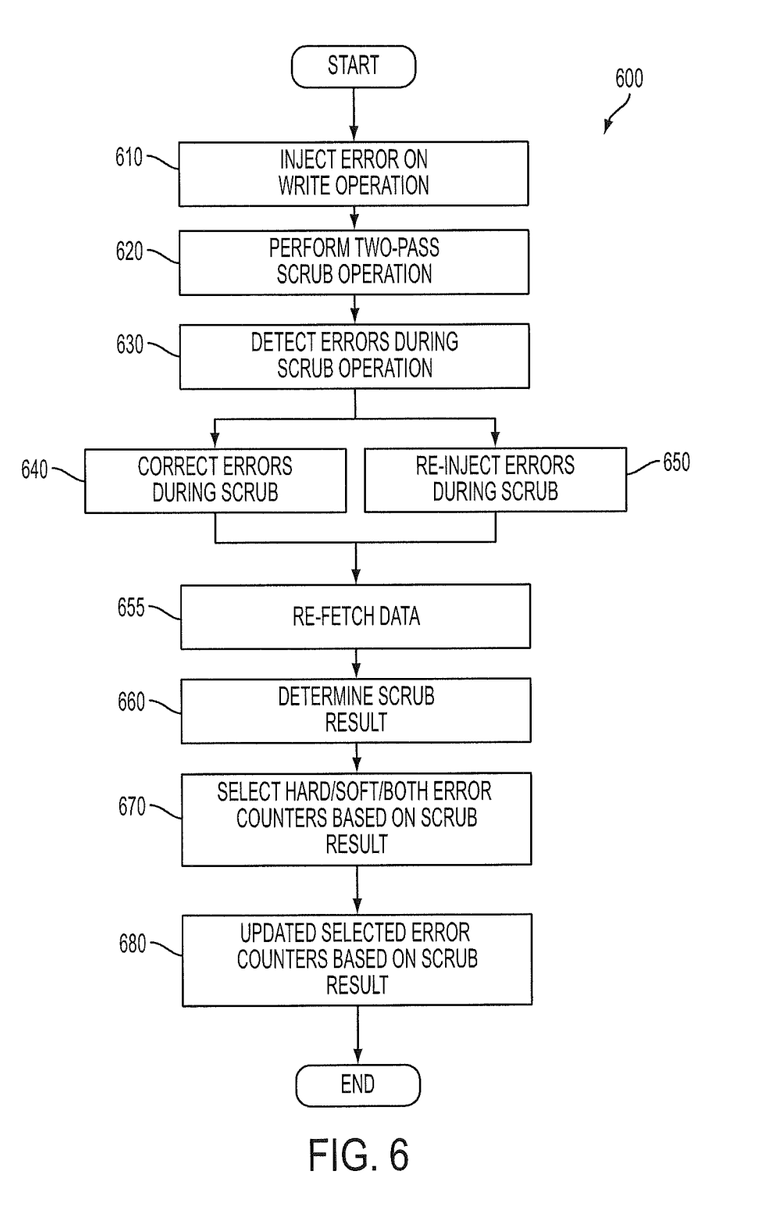
FIG. 6 depicts a flow chart of a memory scrub process in accordance with an embodiment.

Turning now to FIG. 6, a flow chart of a process 600 for a memory scrub operation is generally shown. In an embodiment, the process 600 is implemented in hardware by memory scrub engine 170. In an embodiment, the process 600 is implemented in software in conjunction with specialized hardware. In an embodiment, the process 600 is implemented in microcode or millicode. In an embodiment, the process 600 is implemented in microcode or millicode in conjunction with specialized hardware.

In block 610, an error is injected on a write operation. The write operation is associated with a memory address. The memory address is in turn associated with a memory module and a rank.

Next, at block 620, a scrub fetch operation is initiated. This can be a single patrol fetch for a one-pass scrub fetch/conditional write-back operation or the first pass of a two-pass scrub operation. At block 630, one or more errors are detected during the scrub fetch operation on the memory address.

Next, at block 640, some or all of the errors detected during the scrub operation are corrected. At block 650, in a parallel path, errors detected during the scrub operation are re-injected. Both the error correction and the error re-injection may be controlled by configuration registers as described herein. At block 655, scrub engine 170, in an embodiment, re-fetches the data from the previously stored scrub address.

Next, at block 660, a result of the two-pass scrub operation is determined. The result of the first memory fetch may indicate error or no error. The result of a re-fetch may indicate error or no error. At block 670, one or more error counters are selected based on the result of the two-pass scrub operation. The combination of results from the patrol fetch, store-back, and/or re-fetch indicates a soft error, a hard error, or an intermittent error. Thus, depending on the result of the scrub, a hard error counter, a soft error counter, or both, may be selected. In an embodiment, an intermittent counter may also be selected.

Next, at block 680, the selected counters are then updated based on the result of the scrub operation. For example, as discussed earlier in connection with FIG. 3, if an error occurred the appropriate counter is incremented, else the counter remains as is. A plurality of counters is utilized, associated with memory modules and rank. Thus, the appropriate chip-specific and/or rank-specific counter is selected according to the memory fetch address.

Technical effects and benefits include the ability to perform more thorough and controlled testing of code paths in a memory repair subsystem.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Figure 7:
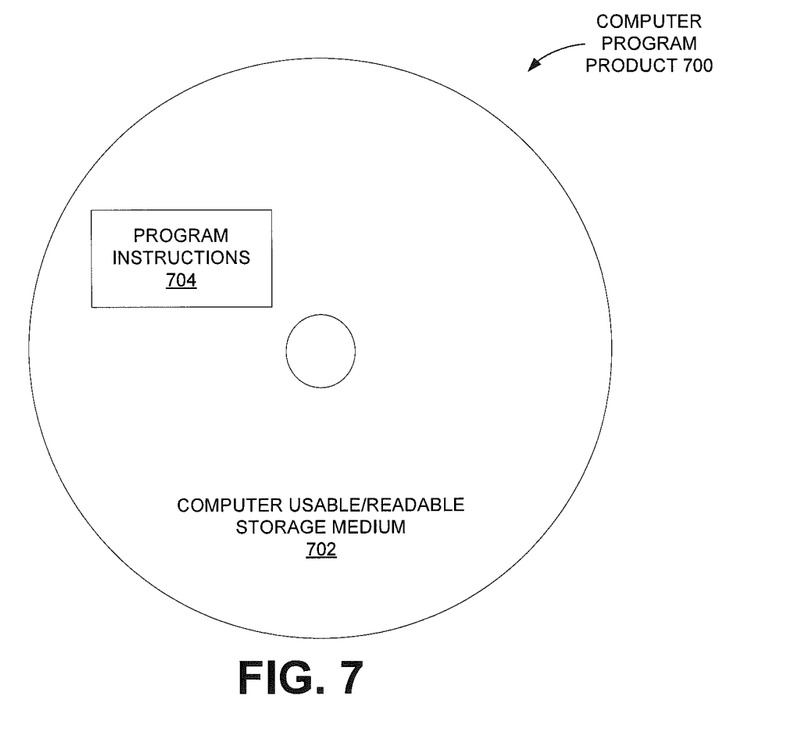
FIG. 7 depicts a computer-readable medium according to an embodiment.

Referring now to FIG. 7, a computer program product 700 in accordance with an embodiment that includes a computer readable storage medium 702 and program instructions 704 is generally shown. The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:
1. A computer implemented method for performing a memory scrub operation, the method comprising:
   injecting an error to test an error count threshold, the injecting on a write operation associated with a memory address;

detecting one or more errors during a two-pass scrub operation on the memory address;

selecting, based on a result of the two-pass scrub operation, one or more of a hard error counter associated with the memory address and a soft error counter associated with the memory address; and updating the one or more selected counters based on the result of the two-pass scrub operation.

2. The computer implemented method of claim 1, further comprising correcting the one or more errors detected during the two-pass scrub operation.

3. The computer implemented method of claim 1, further comprising re-injecting the one or more errors detected during the two-pass scrub operation.

4. The computer implemented method of claim 1, wherein the performing the two-pass scrub operation further includes performing a patrol fetch at the memory address and performing a store-back at the memory address, wherein the injecting the error occurs during the store-back.

5. The computer implemented method of claim 1, setting an injection limit by reading a count field in a configuration register and injecting a number of errors equal to the injection limit.

6. The computer implemented method of claim 1, wherein the injecting the error occurs on a primary store.

7. The computer implemented method of claim 1, wherein the one or more counters are further associated with a memory module and a rank according to the memory address used in the injection, the method further comprising reading a configuration register to determine a target rank for the injection, wherein the injecting an error occurs on the target rank.

* * * * *